(12) United States Patent
Suzuki et al.

(10) Patent No.: US 11,933,336 B2
(45) Date of Patent: Mar. 19, 2024

(54) COUPLING MEMBER AND HOUSING

(71) Applicant: TOSHIBA MITSUBISHI-ELECTRIC INDUSTRIAL SYSTEMS CORPORATION, Chuo-ku (JP)

(72) Inventors: Kenji Suzuki, Chuo-ku (JP); Yoshino Harada, Chuo-ku (JP)

(73) Assignee: TOSHIBA MITSUBISHI-ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 261 days.

(21) Appl. No.: 17/283,175

(22) PCT Filed: Jun. 21, 2019

(86) PCT No.: PCT/JP2019/024702
§ 371 (c)(1),
(2) Date: Apr. 6, 2021

(87) PCT Pub. No.: WO2020/255374
PCT Pub. Date: Dec. 24, 2020

(65) Prior Publication Data
US 2021/0341005 A1 Nov. 4, 2021

(51) Int. Cl.
*F16B 12/50* (2006.01)

(52) U.S. Cl.
CPC .................................. *F16B 12/50* (2013.01)

(58) Field of Classification Search
CPC .......... F16B 7/044; F16B 7/048; F16B 7/185; F16B 12/50; F16B 2012/446;
(Continued)

(56) References Cited

U.S. PATENT DOCUMENTS

| 3,144,265 A * | 8/1964 | Humble | F16B 12/50 403/219 |
| 3,877,138 A * | 4/1975 | Suchowski | F16B 12/50 52/656.9 |

(Continued)

FOREIGN PATENT DOCUMENTS

| DE | 19613586 A1 * | 10/1997 | ............. F16B 12/50 |
| FR | 1601944 A * | 9/1970 | ............. F16B 12/50 |

(Continued)

OTHER PUBLICATIONS

Combined Chinese Office Action and Search Report dated Mar. 30, 2022 in Chinese Patent Application No. 201980067660.2 (with English translation), 12 pages.

(Continued)

*Primary Examiner* — Josh Skroupa
(74) *Attorney, Agent, or Firm* — Oblon, McClelland, Maier & Neustadt, L.L.P.

(57) ABSTRACT

A coupling member includes: first, second, and third portions each having a flat plate-like shape; and a fillet portion. The first portion has a first side and a second side orthogonal to each other. The second portion is bent at the first side relative to the first portion, and extends to an inner surface of the first portion. The third portion is bent at the second side relative to the first portion, and extends to an inner surface of the first portion. A bend radius of an outer surface of the coupling member at the first side is equal to a bend radius of a surface of a first extending member facing the first side. A bend radius of an outer surface of the coupling member at the second side is equal to a bend radius of a surface of a second extending member facing the second side.

5 Claims, 4 Drawing Sheets

(58) Field of Classification Search
CPC .......... E04B 1/1903; H02B 1/30; H05K 7/18; Y10T 403/34; Y10T 403/341; Y10T 403/342; Y10T 403/347; Y10T 403/44; Y10T 403/443; Y10T 403/447
See application file for complete search history.

(56) References Cited

U.S. PATENT DOCUMENTS

| | | | | |
|---|---|---|---|---|
| 3,919,603 | A | * | 11/1975 | Salvati ..................... H02B 1/01 403/363 |
| 4,910,939 | A | * | 3/1990 | Cavanagh ............. E04B 1/2604 403/171 |
| 6,022,165 | A | * | 2/2000 | Lin ....................... E04B 1/2608 403/217 |
| 6,962,262 | B2 | * | 11/2005 | Toma ..................... F16B 12/50 211/189 |
| 2006/0182492 | A1 | * | 8/2006 | Keller ................. F16B 13/0858 403/170 |

FOREIGN PATENT DOCUMENTS

| | | | | | |
|---|---|---|---|---|---|
| GB | 1552695 | A | * | 9/1979 | .............. F16B 12/50 |
| GB | 2232426 | A | * | 12/1990 | .............. F16B 12/50 |
| JP | 7-317733 | A | | 12/1995 | |
| JP | 2000-324624 | A | | 11/2000 | |
| JP | 2001-355616 | A | | 12/2001 | |
| JP | 2004-332254 | A | | 11/2004 | |
| JP | 2009-144848 | A | | 7/2009 | |
| JP | 2012-85913 | A | | 5/2012 | |
| JP | 2014-81053 | A | | 5/2014 | |
| JP | 2014081053 | A | * | 5/2014 | .............. F16B 12/50 |
| JP | 2015-218806 | A | | 12/2015 | |
| JP | 2015218806 | A | * | 12/2015 | .............. F16B 12/50 |

OTHER PUBLICATIONS

Combined Chinese Office Action and Search Report dated Sep. 26, 2022 in Chinese Patent Application No. 201980067660.2 (with unedited computer generated English Translation), 15 pages.
Indian Office Action dated Aug. 12, 2022 in Indian Patent Application No. 202117016636, 5 pages.
International Search Report dated Jul. 30, 2019 in PCT/JP2019/024702 filed Jun. 21, 2019, 2 pages.
Japanese Office Action dated Jan. 19, 2021 in Japanese Patent Application No. 2019-560796 (with English translation), 15 pages.
Written Opinion of the International Searching Authority dated Jul. 30, 2019 in PCT/JP2019/024702 (with English translation), 12 pages.
Office Action dated Feb. 27, 2023, in corresponding Chinese Patent Application No. 201980067660.2 (with English Translation), 12 pages.
Office Action dated Mar. 16, 2023, in corresponding Korean Patent Application No. 10-2021-7010354 (with English Translation), 12 pages.

* cited by examiner

COUPLING MEMBER AND HOUSING

TECHNICAL FIELD

The present invention relates to a coupling member and a housing.

BACKGROUND ART

Japanese Patent Laying-Open No. 2000-324624 (Patent Literature 1) proposes a frame structure of a housing to attain a reduced assembly operation time, improved assembly precision, and reduced weight and cost. The frame structure described in Patent Literature 1 includes: a plurality of frames each constituted of a steel plate; and coupling means for coupling the frames to one another, the coupling means being employed together with a fastening member (rivet) and an adhesive agent.

CITATION LIST

Patent Literature

PTL 1: Japanese Patent Laying-Open No. 2000-324624

SUMMARY OF INVENTION

Technical Problem

At each corner portion of the frame structure described in Patent Literature 1, the frames are coupled to one another via a corner reinforcement portion having three-directional bent lines extending perpendicularly to one another. However, it cannot be said that the strength of the corner reinforcement portion is sufficient, and there is room for improvement.

Hence, the present invention has a main object to provide a coupling member for coupling a plurality of extending members to each other so as to attain reduced weight and improved strength. Moreover, the present invention has another object to provide a housing employing the coupling member.

Solution to Problem

A coupling member according to a certain aspect of the present invention is a coupling member for coupling at least two extending members to each other, and includes: a first portion having a flat plate-like shape; a second portion having a flat plate-like shape; a third portion having a flat plate-like shape; and a fillet portion. The first portion has a first side extending straightly and a second side orthogonal to the first side and extending straightly. The second portion is bent at the first side relative to the first portion, and extends perpendicularly to an inner surface of the first portion. The third portion is bent at the second side relative to the first portion, and extends perpendicularly to the inner surface of the first portion. The fillet portion protrudes perpendicularly to an inner surface of the second portion, and is disposed to face the third portion. A bend radius of an outer surface of the coupling member at the first side is equal to a bend radius of a surface of a first extending member facing the first side. A bend radius of the outer surface of the coupling member at the second side is equal to a bend radius of a surface of a second extending member facing the second side.

Advantageous Effects of Invention

According to the present invention, there can be provided a coupling member and a housing to attain reduced weight and improved strength.

DESCRIPTION OF EMBODIMENTS

Figure 1:
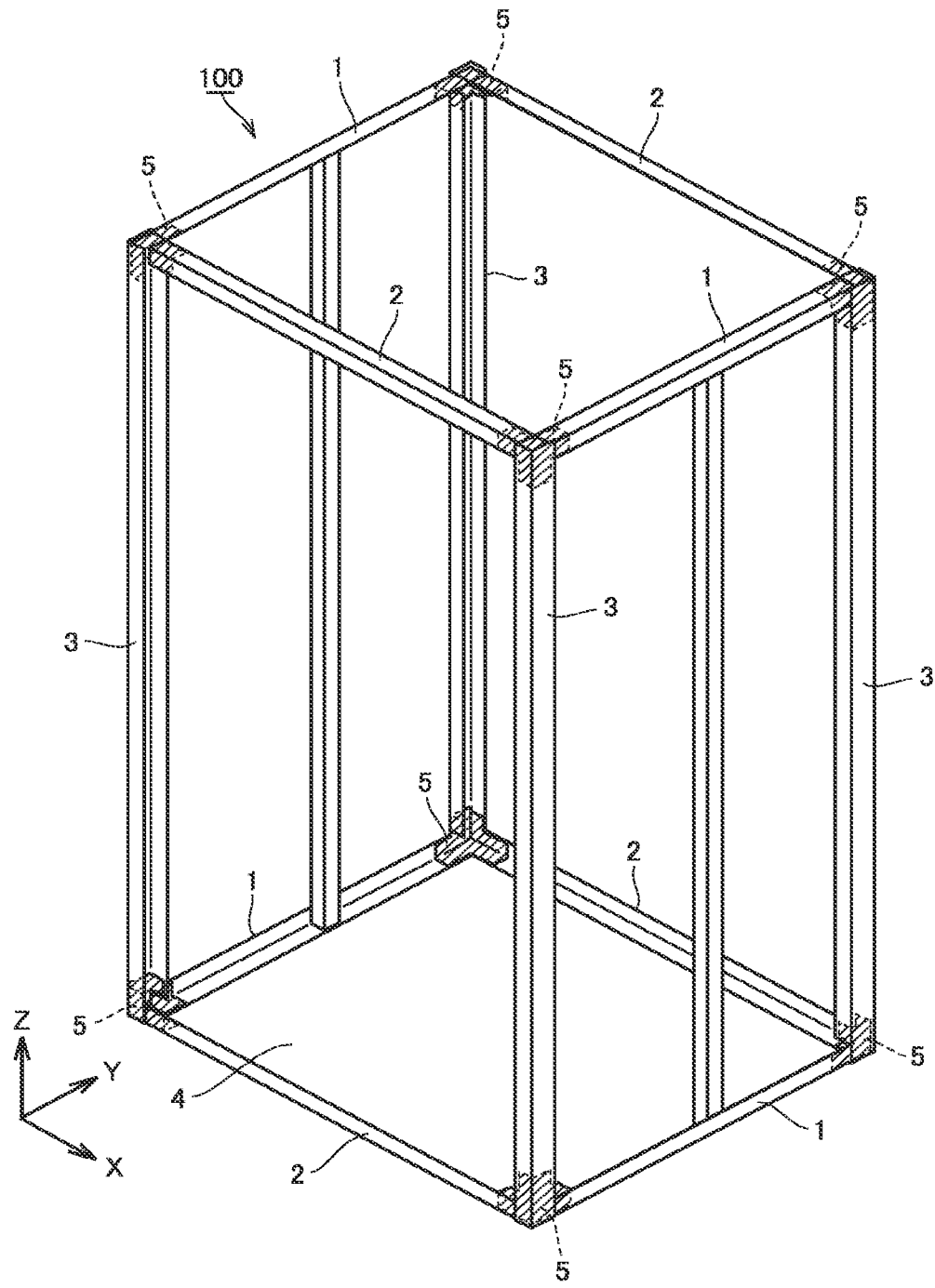
FIG. 1 is a perspective view of a housing to which a coupling member according to the present embodiment is applied.

The following describes an embodiment of the present invention with reference to figures. It should be noted that in the below-described figures, the same or corresponding portions are given the same reference characters and are not described repeatedly.

FIG. 1 is a perspective view of a housing to which a coupling member according to the present embodiment is applied. FIG. 1 schematically shows a frame structure of a housing 100.

With reference to FIG. 1, housing 100 is formed by coupling a plurality of frame members to one another. The plurality of frame members include: first beam members 1 each extending in the horizontal direction (Y direction in the figure); second beam members 2 each extending in the horizontal direction (X direction in the figure); and pillar members 3 each extending in the vertical direction (Z direction in the figure). Each of first beam members 1, second beam members 2, and pillar members 3 corresponds to one implementation of an "extending member" extending straightly.

Housing 100 further includes coupling members 5 each for coupling at least two extending members to each other. Coupling members 5 are disposed at corner portions of housing 100, and are used to couple first beam members 1, second beam members 2, and pillar members 3 to one another.

Figure 2:
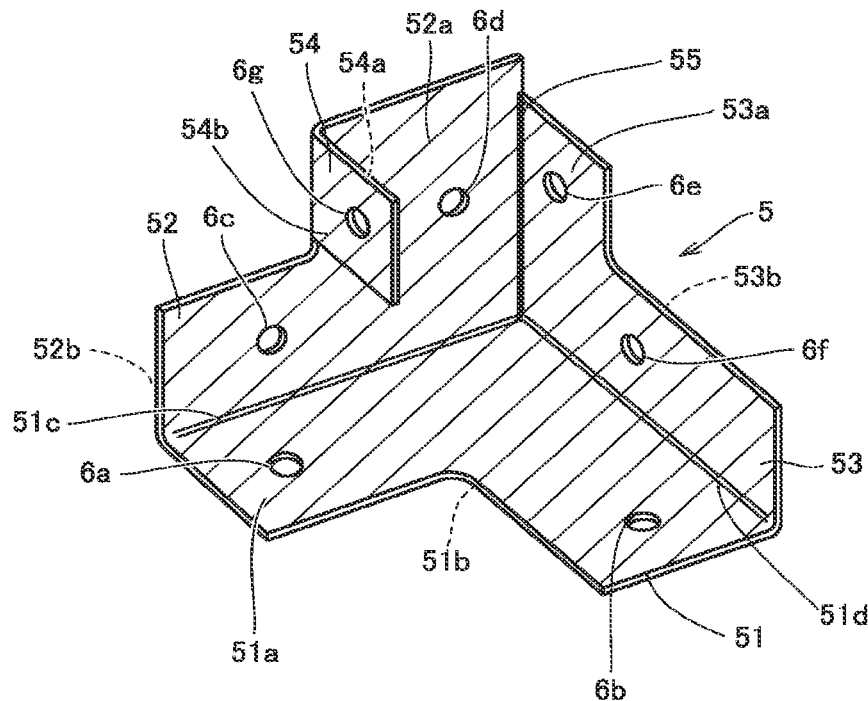
FIG. 2 is a perspective view of the coupling member according to the present embodiment.

FIG. 2 is a perspective view of each coupling member 5. With reference to FIG. 2, coupling member 5 has a first portion 51, a second portion 52, a third portion 53, and a fillet portion 54.

First portion 51 has a flat shape, and has an inner surface 51a serving as one surface and an outer surface 51b serving as the other surface. First portion 51 has: a first side 51c extending straightly; and a second side 51d orthogonal to first side 51c and extending straightly.

First portion 51 has such a shape that one vertex portion of a quadrangle is cut out. This cutout is formed in the form of a quadrangle at the one vertex portion of the foregoing quadrangle. However, the shape of the cutout is not limited to this.

First portion 51 is provided with a plurality of through holes 6a, 6b extending through first portion 51 in the thickness direction. Each of through holes 6a, 6b is chamfered on the inner surface 51a side. It should be noted that the number of the through holes is not limited to two.

Second portion 52 has a flat shape, and has an inner surface 52a serving as one surface and an outer surface 52b serving as the other surface. Second portion 52 is bent at first side 51c relative to inner surface 51a of first portion 51, and extends perpendicularly to inner surface 51a.

Second portion 52 is provided with a plurality of through holes 6c, 6d extending through second portion 52 in the thickness direction. Each of through holes 6c, 6d is chamfered on the inner surface 52a side. It should be noted that the number of the through holes is not limited to two.

Third portion 53 has a flat shape, and has an inner surface 53a serving as one surface and an outer surface 53b serving as the other surface. Third portion 53 is bent at second side 51d relative to inner surface 51a of first portion 51, and extends perpendicularly to inner surface 51a. Third portion 53 is provided with a plurality of through holes 6e, 6f extending through third portion 53 in the thickness direction. Each of through holes 6e, 6f is chamfered on the inner surface 53a side. It should be noted that the number of the through holes is not limited to two.

First portion 51, second portion 52, and third portion 53 are disposed orthogonal to one another. First portion 51 is connected to second portion 52 at first side 51c. First portion 51 is connected to third portion 53 at second side 51d. A space 55 is formed between second portion 52 and third portion 53.

Fillet portion 54 has a flat shape, and has a first surface 54a serving as one surface and a second surface 54b serving as the other surface. Fillet portion 54 is bent relative to inner surface 52a of second portion 52, and protrudes perpendicularly to inner surface 52a. First surface 54a of fillet portion 54 faces third portion 53, and is provided in parallel with third portion 53.

Fillet portion 54 is provided with a through hole 6g extending through fillet portion 54 in the thickness direction. Through hole 6g is chamfered on the first surface 54a side. It should be noted that the number of the through holes is not limited to one.

Figure 3:
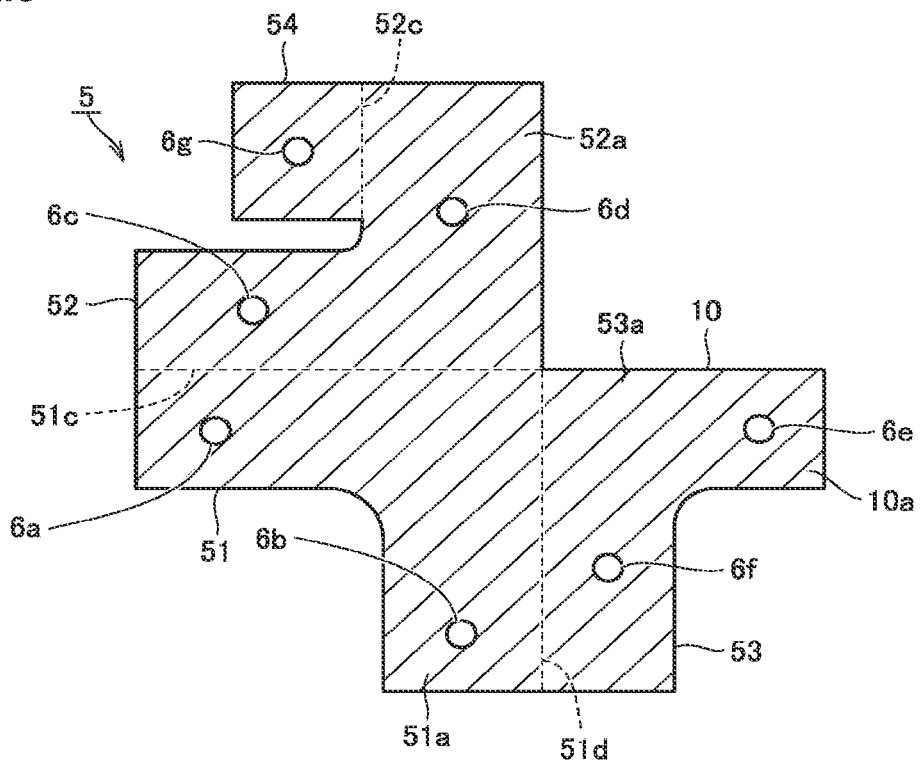
FIG. 3 is a developed view of the coupling member according to the present embodiment.

FIG. 3 is a developed view of coupling member 5 shown in FIG. 2.

With reference to FIG. 3, coupling member 5 is formed by performing a perforating process and a bending process onto a flat plate member 10. Examples of a material for flat plate member 10 include: a steel plate such as a soft steel or a stainless steel; an aluminum plate; and the like. The thickness of flat plate member 10 is about 1 to 3.5 mm, for example.

By bending flat plate member 10 at a right angle relative to a portion at which first portion 51 is formed, second portion 52 and third portion 53 are formed. Further, by bending flat plate member 10 at a right angle relative to second portion 52, fillet portion 54 is formed.

That is, inner surface 10a of flat plate member 10 constitutes inner surface 51a of first portion 51, inner surface 52a of second portion 52, inner surface 53a of third portion 53, and first surface 54a of fillet portion 54. Outer surface 10b of flat plate member 10 constitutes outer surface 51b of first portion 51, outer surface 52b of second portion 52, outer surface 53b of third portion 53, and second surface 54b of fillet portion 54.

Each of first side 51c and second side 51d is located at the central portion of the bending of flat plate member 10. Third side 52c of second portion 52 is located at the central portion of the bending of flat plate member 10.

Since coupling member 5 can be formed by performing the bending process onto flat plate member 10 in this way, workability of coupling member 5 is improved. Moreover, since coupling member 5 can be formed from only one component (flat plate member 10), reduced weight and cost of the coupling member can be attained as compared with a case where the coupling member is formed by combining a plurality of components.

When the coupling member is formed by combining a plurality of components, an operation for aligning the components is required, with the result that an assembly operation for the housing is complicated and takes time, disadvantageously. On the other hand, the alignment operation is not necessary in the case of coupling member 5 according to the present embodiment, thereby improving the workability of housing 100.

Next, the following describes housing 100 in which the plurality of extending members are coupled to one another using coupling members 5 according to the embodiment.

Figure 4:
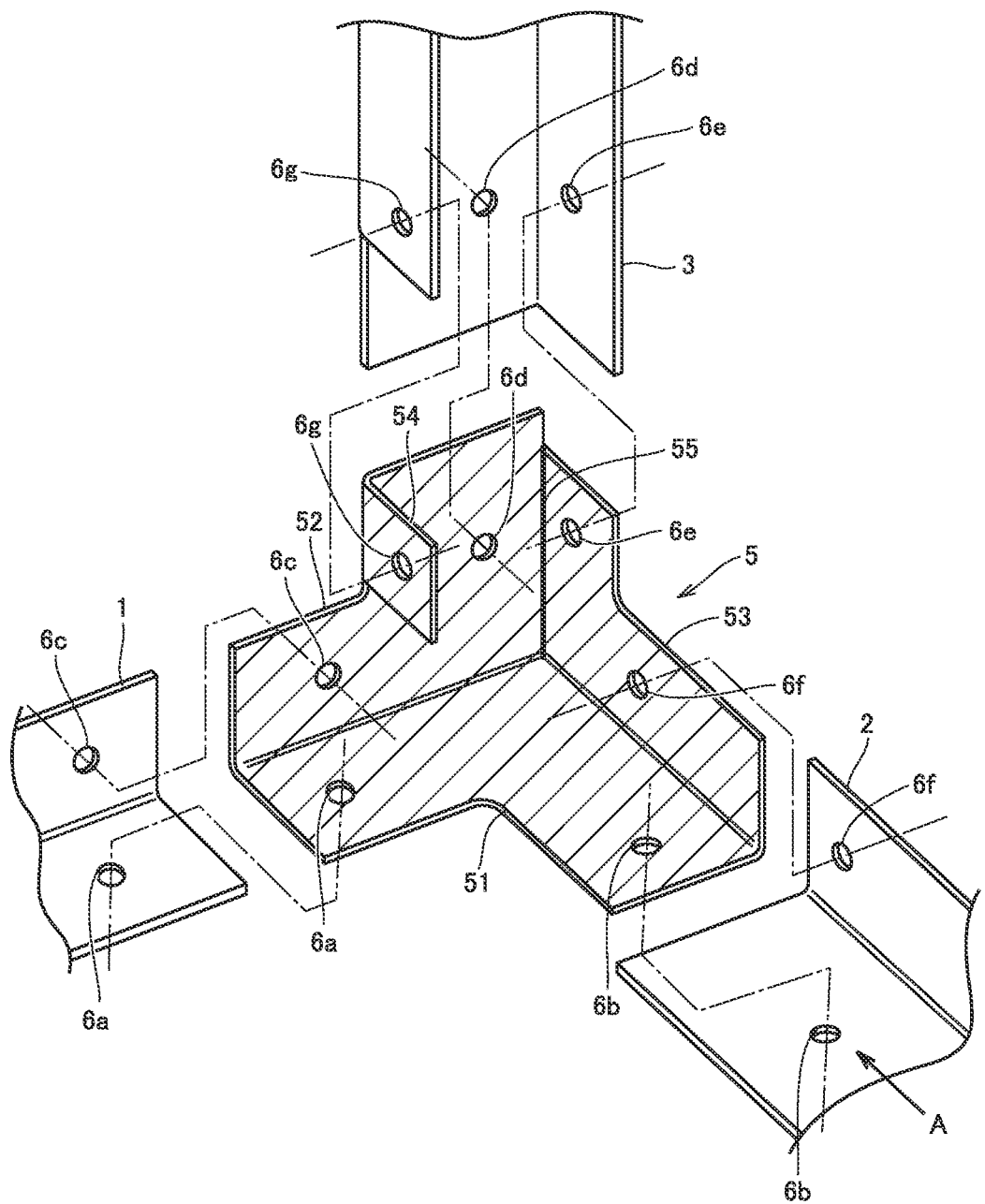
FIG. 4 is an exploded perspective view at a corner portion of the housing.

FIG. 4 is an exploded perspective view at a corner portion of housing 100. FIG. 4 only shows portions of beam members 1, 2 and pillar member 3 in the vicinity of the corner portion of housing 100.

First beam member 1 is fixed to first portion 51 through rivet connection using a rivet (not shown) extending in through hole 6a. Also, first beam member 1 is fixed to second portion 52 through rivet connection using a rivet (not shown) extending in through hole 6c. Each of through hole 6a formed in first portion 51 and through hole 6c formed in second portion 52 has a function as a rivet hole in which a rivet for coupling first beam member 1 to coupling member 5 extends.

Second beam member 2 is fixed to first portion 51 through rivet connection using a rivet (not shown) extending in through hole 6b. Also, second beam member 2 is fixed to third portion 53 through rivet connection using a rivet (not shown) extending in through hole 6f. Each of through hole 6b formed in first portion 51 and through hole 6f formed in third portion 53 has a function as a rivet hole in which a rivet for coupling second beam member 2 to coupling member 5 extends.

Pillar member 3 is fixed to second portion 52 through rivet connection using a rivet (not shown) extending in through hole 6d. Also, pillar member 3 is fixed to third portion 53 through rivet connection using a rivet extending in through hole 6e. Further, pillar member 3 is fixed to fillet portion 54 through rivet connection using a rivet (not shown) extending in through hole 6g. Each of through hole 6d formed in second portion 52, through hole 6e formed in third portion 53 and through hole 6g formed in fillet portion 54 has a function as a rivet hole in which a rivet for coupling pillar member 3 to coupling member 5 extends. The inner surface of pillar member 3 is connected to second portion 52, third portion 53, and fillet portion 54 through the rivet connection, thereby improving strength of the inner surface of pillar member 3. Accordingly, strength of housing 100 can be improved.

Thus, first beam member 1, second beam member 2, and pillar member 3, which serve as the plurality of extending members, are coupled to one another via coupling member 5 through the rivet connection, thereby forming housing 100. Since first beam member 1, second beam member 2, and pillar member 3 are coupled to each other only by the riveting without performing welding, workability of housing 100 can be improved.

On the other hand, it is concerned that the strength of coupling member 5 may be decreased due to coupling member 5 being constituted only of flat plate member 10, as compared with a case where a plurality of components are combined. When the strength of coupling member 5 becomes low, coupling strength among the plurality of extending members coupled to one another by coupling member 5 also becomes low, with the result that the strength of housing 100 is decreased. It should be noted that the strength of coupling member 5 can be increased by increasing the thickness of flat plate member 10; however, the weight of coupling member 5 is increased to result in an increased weight of housing 100.

To address this, in coupling member 5 according to the present embodiment, the bend radius of flat plate member 10 in the bending process is adjusted, thereby improving connection strength between coupling member 5 and the extending member.

Accordingly, a load applied to coupling member 5 can be distributed to the extending members, thereby increasing the strength of coupling member 5.

Figure 5:
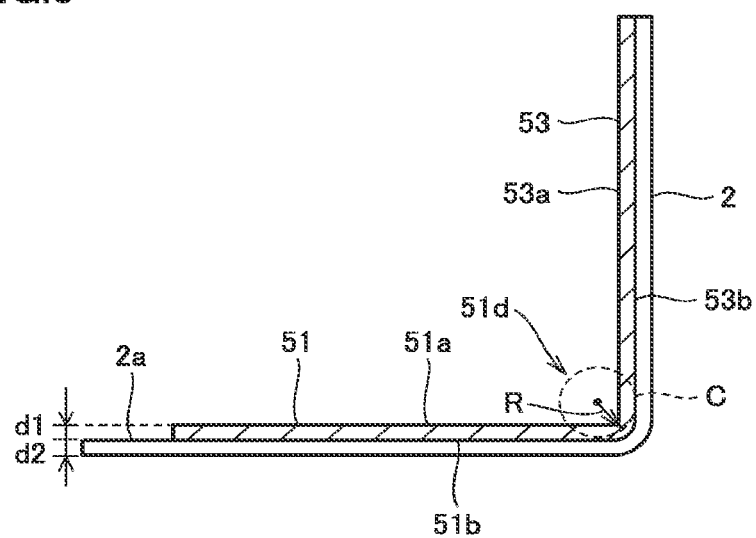
FIG. 5 is a diagram when seen in a direction of arrow A shown in FIG. 4.

FIG. 5 is a diagram when seen in a direction of arrow A shown in FIG. 4. FIG. 5 shows only portions of first portion 51 and third portion 53 of coupling member 5 and second beam member 2

As described above, third portion 53 is formed by bending flat plate member 10 at a right angle relative to inner surface 51a of first portion 51.

Second beam member 2 is disposed such that inner surface 2a of second beam member 2 is in surface contact with outer surface 51b of first portion 51 and outer surface 53b of third portion 53. Second side 51d of first portion 51 is located at the central portion of the bending. In FIG. 5, R represents the bend radius of outer surface 51b at second side 51d. Bend radius R corresponds to the radius of a circle C indicating a curve having the same size as that of the central portion of the bending of outer surface 51b. This bend radius R is made equal to the bend radius of inner surface 2a of second beam member 2. It should be noted that in the specification of the present application, the expression "the bend radii are equal" means that the bend radii are substantially equal to each other, and encompasses a case where the bend radii are close to each other to such an extent that the surface contact can be secured. The expression "the bend radii are equal" corresponds to, for example, a case where a variation in bend radii is within ±10% relative to one value.

In this way, also at the portion of second side 51d, contact between first portion 51 and second beam member 2 can be improved, whereby connection strength between coupling member 5 and second beam member 2 can be improved.

Assuming that the thickness of each of first portion 51 and third portion 53 is represented by d1 and the thickness of second beam member 2 is represented by d2 in FIG. 5, when thickness d1 is made thin, coupling member 5 is reduced in weight but the strength of each of first portion 51 and third portion 53 is decreased. By increasing the connection strength between second beam member 2 and each of first portion 51 and third portion 53, first portion 51 and third portion 53 can be reinforced by second beam member 2. It can be deemed that each of first portion 51 and third portion 53 has a thickness corresponding to the total of thickness d1 and thickness d2. With this, even when thickness dl of each of first portion 51 and third portion 53 is made thin, the strength of each of first portion 51 and third portion 53 can be secured.

Returning to FIG. 4, by causing the bend radius of outer surface 51b at first side 51c to be equal to the bend radius of inner surface 1a of first beam member 1 in coupling member 5, connection strength between coupling member 5 and first beam member 1 can be improved.

Further, by causing the bend radius of outer surface 52b of second portion 52 to be equal to the bend radius of inner surface 3a of pillar member 3 also in fillet portion 54, connection strength between coupling member 5 and pillar member 3 can be improved. As a result, even when the thickness of coupling member 5 is made thin, coupling strength between the plurality of extending members coupled to each other by coupling member 5 can be improved, whereby the strength of housing 100 can be improved. That is, the weight of coupling member 5 can be reduced while securing the strength of coupling member 5.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

1: first beam member; 2: second beam member; 3: pillar member; 5: coupling member; 6a to 6g: through hole; 51: first portion; 51a, 52a, 53a, 54a: inner surface; 51b, 52b, 53b, 54b: outer surface; 51c: first side; 51d: second side; 52: second portion; 53: third portion; 54: fillet portion; 100: housing.

The invention claimed is:
1. A housing comprising:
at least two extending members; and
a coupling member for coupling the at least two extending met bens to each other,
wherein the coupling member includes:
    a first portion having a flat plate-like shape, the first portion having a first side extending straightly and a second side orthogonal to the first side and extending straightly;
    a second portion having a flat plate-like shape, the second portion being bent at the first side relative to the first portion, the second portion extending perpendicularly to an inner surface of the first portion;
    a third portion having a flat plate-like shape, the third portion being bent at the second side relative to the first portion, the third portion extending perpendicularly to the inner surface of the first portion; and
    a fillet portion having a flat plate-like shape, the fillet portion protruding perpendicularly to an inner surface of the second portion, the fillet portion being disposed to face the third portion,
wherein a bend radius of an outer surface of the coupling member at the first side is equal to a bend radius of a surface of a first extending member facing the first side, and
a bend radius of the outer surface of the coupling member at the second side is equal to a bend radius of a surface of a second extending member facing the second side
wherein each of the first portion, the second portion, the third portion, and the fillet portion is formed by a bending process onto a flat plate member, and
wherein each of the first portion, the second portion, the third portion, and the fillet portion is provided with at least one through hole for coupling the first and second extending members to the coupling member through rivet connection, the at least one through hole extending through a corresponding one of the first portion, the second portion, the third portion, and the fillet portion in a thickness direction.

2. The housing according to claim 1, wherein
the coupling member couples three extending members to one another,
the second portion has a third side orthogonal to the first side and the second side and extending straightly,
the fillet portion is bent at the third side relative to the second portion and protrudes perpendicularly to an inner surface of the second portion, and
a bend radius of the outer surface of the coupling member at the third side is equal to a bend radius of a surface of a third extending member facing the third side.

3. The housing according to claim 2,
wherein the first extending member is a beam member extending in a horizontal direction, and
the third extending member is a pillar member extending in a vertical direction.

4. The housing according to claim 1, wherein a space is formed between the second portion and the third portion.

5. The housing according to claim 1,
wherein the first extending member is a first beam member extending in a horizontal direction, and
the second extending member is a second beam member extending in the horizontal direction.

* * * * *